United States Patent
Suzuki et al.

(10) Patent No.: US 6,903,973 B2
(45) Date of Patent: Jun. 7, 2005

(54) SEMICONDUCTOR MEMORY DEVICE

(75) Inventors: Toshikazu Suzuki, Nishinomiya (JP); Hironori Akamatsu, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 28 days.

(21) Appl. No.: 10/714,588

(22) Filed: Nov. 14, 2003

(65) Prior Publication Data

US 2005/0073885 A1 Apr. 7, 2005

(30) Foreign Application Priority Data

Nov. 18, 2002 (JP) ........................................ 2002-334260

(51) Int. Cl.$^7$ ............................................. G11C 11/34
(52) U.S. Cl. ................................... 365/185.2; 365/200
(58) Field of Search ............................... 365/185.2, 200

(56) References Cited

U.S. PATENT DOCUMENTS

| | | | | |
|---|---|---|---|---|
| 4,608,666 A | * | 8/1986 | Uchida | 365/222 |
| 5,124,948 A | * | 6/1992 | Takizawa et al. | 365/200 |
| 5,157,632 A | * | 10/1992 | Tsutsui | 365/208 |
| 5,257,230 A | * | 10/1993 | Nobori et al. | 365/200 |
| 5,265,061 A | * | 11/1993 | Tanaka | 365/210 |
| 5,289,413 A | * | 2/1994 | Tsuchida et al. | 365/189.02 |
| 6,172,925 B1 | | 1/2001 | Blocker | |
| 6,212,117 B1 | | 4/2001 | Shin et al. | |
| 6,556,472 B2 | | 4/2003 | Yokozeki | |

OTHER PUBLICATIONS

Osada, et al., "Universal-$V_{dd}$ 0.65–2.0–V 32–kB Cache Using a Voltage–Adapted Timing–Generation Scheme and a Lithographically Symmetrical Cell", IEEE Journal of Solid-State Circuits, vol. 36, No. 11, Nov., 2001, pp. 1738–1744.

* cited by examiner

*Primary Examiner*—Michael Tran
(74) *Attorney, Agent, or Firm*—Merchant & Gould P.C.

(57) ABSTRACT

A semiconductor memory device capable of accurately simulating a read-out timing of a memory cell and enhancing a production yield is provided. A dummy column selector is placed so as to be connected to dummy bit lines, and a plurality of dummy cells driving the dummy bit lines are placed at positions farthest in a column direction on a memory array from the side where an amplifier circuit is placed. This configuration allows a timing for driving the bit lines by the memory cells that are placed similarly at positions farthest from the amplifier circuit to be simulated accurately, thus enabling the generation of an amplifier startup signal without delay. Furthermore, a plurality of dummy word lines respectively connected to the plurality of dummy columns allow for readily switching from a dummy cell with a defect to a normal dummy cell.

15 Claims, 18 Drawing Sheets

SEMICONDUCTOR MEMORY DEVICE

BACKGROUND OF THE INVENTION

1. Field of the Invention

The present invention relates to a semiconductor memory device that generates a startup timing of an amplifier circuit using a dummy circuit.

2. Related Background Art

In conventional semiconductor memory devices, various methods have been considered to generate a startup signal of an amplifier for amplifying data read out from a memory cell by using a dummy memory cell so as to allow a startup timing of the amplifier to follow precisely the fluctuations in memory-cell reading-out timing caused by a process, a voltage and the like.

As a configuration example of the conventional semiconductor memory devices, FIG. 15 to FIG. 18 schematically show circuit configurations disclosed in "IEEE JOURNAL OF SOLID-STATE CIRCUITS, November 2001, Vol. 36, No. 11, pp. 1738–1744) and U.S. Pat. No. 6,212,117.

In FIG. 15, reference numeral 500 denotes a memory array, 501 denotes an edge column (optical dummy column) included in the memory array 500, 502 denotes a dummy column included in the memory array 500 and 504 denotes a plurality of normal columns included in the memory array 500, respectively. Herein, the normal columns refer to those columns other than the edge column and the dummy column.

Furthermore, reference numeral 505 denotes a dummy control circuit connected to the memory array 500, 507 denotes an amplifier control circuit to which an output signal from the dummy column 502 is input, 508 denotes a column selector connected to the normal columns 504, 509 denotes an amplifier circuit connected to the column selector 508 and the amplifier control circuit 507, and 510 denotes a row decoder connected to the memory array 500, respectively.

FIG. 16 shows a partial configuration of the memory array 500 shown in FIG. 15. In FIG. 16, reference numeral 511 denotes normal memory cells, and SRAMs are used often as the normal memory cells. Reference numeral 512 denotes edge cells included in the edge column 501, which is placed for avoiding the deformation of a physical pattern of the normal memory cells 511 at an edge portion of the array, and 513 denotes dummy cells included in the dummy column 502, respectively.

FIG. 17 shows a configuration of the memory cell 511 shown in FIG. 16, and FIG. 18 shows internal configurations of the edge cell 512 and the dummy cell 513 shown in FIG. 16 and an interconnection configuration therebetween.

As shown in FIG. 18, transistors constituting the edge cell 512 and the dummy cell 513 have the same size as that of transistors constituting the memory cell 511 shown in FIG. 17, and latch circuits included in the edge cell 512 and the dummy cell 513 are fixed at a constant level.

As shown in FIG. 16, the memory cells 511 are connected to word lines WL0 to WLx that are connected to the row decoder 510 in a row direction, and are connected to common bit lines BL and NBL in a column direction.

Among the plurality of edge cells 512, n edge cells 512 are connected to a dummy word line DWL on an output side of the dummy control circuit 505, and the other edge cells 512 are connected to a ground line. The n edge cells 512 have a configuration such that the n edge cells are arranged sequentially from a position closer to a side of the amplifier circuit 509.

Among the plurality of dummy cells 513, n dummy cells 513 are connected to the dummy word line DWL on the output side of the dummy control circuit 505, and the other dummy cells 513 are connected to the ground line. Furthermore, the plurality of dummy cells 513 are connected to the common dummy bit line DBL, and the dummy bit line DBL is connected to the amplifier control circuit 507. Similarly to the n edge cells, the n dummy cells 513 also have a configuration such that the n dummy cells are arranged sequentially from a position closer to a side of the amplifier circuit 509.

When the thus configured conventional semiconductor memory device operates, any one of the word lines WL0 to WLx connected to the row decoder 510 is selected, and data in the memory cell 511 connected to the selected word line is read out onto the bit lines BL and NBL.

Note here that the bit lines BL and NBL and the dummy bit line DBL are precharged in advance to a high level so as to be in a floating state at the time when the word lines WL0 to WLx are selected. Furthermore, since there are a plurality of normal columns 504, data in a plurality of memory cells 511 connected to the selected word line are read out onto the respective bit lines BL and NBL, and data, in particular bit lines BL and NBL, are selected by the column selector 508.

At almost the same time the word lines WL0 to WLx are selected, the dummy word line DWL on the output side of the dummy control circuit 505 is driven, so that transistors constituting the n dummy cells 513 allow a signal level of the dummy bit line DBL to change from a high level to a low level at a slew rate that is n times that of the memory cell 511.

Then, the signal level of the dummy bit line DBL is detected, whereby the amplifier control circuit 507 generates an amplifier startup signal SAE, resulting in the amplifier circuit 509 amplifying data in the selected particular bit lines BL and NBL at a time when the amplifier startup signal SAE is input.

For example, in the case where it is attempted to start up the amplifier circuit 509 when a power supply voltage is 1.2 V and a potential difference between the read-out data (BL) and (NBL) from the memory cell 511 is 100 mV, if the number of the dummy cells 513 to be selected is set at "6", the potential of the dummy bit line DBL changes to 600 mV, that is, to a half of the power supply voltage, at a desired amplifier startup timing. Therefore, there is an advantage that an amplifier startup signal SAE can be generated merely by using a simple CMOS gate and not using a complicated potential detection circuit.

In the above-described conventional semiconductor memory device, however, although wiring loads of the bit lines BL and NBL connected to the memory cells 511 are included in the dummy circuit, a load of the column selector 508 connected to the bit lines is not included in the dummy circuit. Therefore, there occurs a problem that the generation of a SAE signal based on a dummy bit line signal is delayed relative to the desired amplifier startup timing.

Furthermore, in the above-described conventional semiconductor memory device, the dummy cells 513 for driving the dummy bit line DBL are placed in the proximity of the amplifier circuit 509 with respect to the memory array 500. In the case where a memory cell 511 placed at an edge portion on an opposite side of the amplifier circuit 509 is selected, the delay due to the wiring resistance of the bit lines BL and NBL is not reflected, which means another problem that the generation of the SAE signal based on the dummy bit line signal is advanced relative to the desired amplifier startup timing.

Moreover, in the above-described conventional semiconductor memory device, the dummy cells 513 are configured so as to operate at every read-out access to the memory array 500, and such memory inherently has a problem that, in the case where the dummy cells 513 have a defect, the amplifier cannot be started up at the desired timing or such a defect may result in a defective product that is incapable of even starting up the amplifier.

SUMMARY OF THE INVENTION

Therefore, with the foregoing in mind, it is an object of the present invention to provide a semiconductor memory device capable of simulating accurately a read-out timing of a memory cell and enhancing a production yield.

In order to achieve the above-stated object, a semiconductor memory device according to the present invention includes: a memory array including a plurality of memory cells and a plurality of dummy cells; a row decoder connected to the memory. array; a column selector that selects a normal column of the plurality of memory cells; an amplifier circuit that amplifies data in the memory cell selected by the row decoder and the column selector; a dummy control circuit that selectively activates, through a plurality of dummy word lines, at least one dummy cell among the plurality of dummy cells with respect to each of the dummy word lines; a dummy column selector that selects a signal from the dummy cell activated by the dummy control circuit; and an amplifier control circuit that generates an amplifier startup signal for the amplifier circuit, based on the signal selected by the dummy column selector.

This configuration allows a load of the column selector connected to the bit lines to be included in the dummy circuit, and therefore the SAE signal based on the signal of the dummy bit line can be generated in accordance with a desired amplifier startup timing.

In the semiconductor memory device according to the present invention, it is preferable that the memory array includes a plurality of dummy columns including the plurality of dummy cells and a plurality of dummy bit lines that are connected commonly to the plurality of dummy cells in the plurality of dummy columns, and the plurality of dummy bit lines are connected to the dummy column selector.

With this configuration, even in the case where the dummy cells have a defect, a dummy bit line connected to a normal dummy cell can be selected, whereby the production yield can be improved.

Furthermore, in the semiconductor memory device according to the present invention, it is preferable that the plurality of dummy word lines are connected to the memory array from a same side as or from a side opposite to a side where the amplifier circuit is placed, and are connected respectively to a part of the plurality of dummy cells included in the plurality of dummy columns.

With this configuration, in the case where the plurality of dummy word lines are connected from the same side as the side where the amplifier circuit is placed, the wiring area to the dummy column can be reduced, and in the case where they are connected from the opposite side, consideration can be given to wiring loads on the row decoder also.

Furthermore, in the semiconductor memory device according to the present invention, it is preferable that the plurality of dummy cells connected to the dummy word lines are placed with respect to the memory array at an edge portion on an opposite side to a side where the amplifier circuit is placed.

This configuration allows a timing for driving the bit lines by the memory cells that are placed at positions farthest from the amplifier circuit also to be simulated accurately.

Furthermore, in the semiconductor memory device according to the present invention, it is preferable that the memory array includes a dummy column and a plurality of dummy rows that include the plurality of dummy cells, the plurality of dummy word lines are connected to the plurality of dummy rows, and the dummy column includes one dummy bit line.

With this configuration, consideration can be given to wiring loads on the row decoder also.

Furthermore, in the semiconductor memory device according to the present invention, the memory array may include a dummy column including the plurality of dummy cells, and the plurality of dummy word lines respectively may be connected to the dummy cells placed at different positions on the dummy column.

Furthermore, in the semiconductor memory device according to the present invention, the dummy bit line may be connected to the dummy column selector.

Furthermore, in the semiconductor memory device according to the present invention, the column selector may include a transfer gate, and the dummy column selector may include a transfer gate having the same configuration as that of the transfer gate included in the column selector.

Furthermore, in the semiconductor memory device according to the present invention, it is preferable that a transistor constituting the transfer gate that is connected to the dummy bit line and is included in the dummy column selector has a source and a drain that are short-circuited.

This configuration can prevent a delay in the generation of an amplifier startup signal from occurring, which results from a deterioration of a transistor current ability.

Furthermore, in the semiconductor memory device according to the present invention, the dummy control circuit may include a memory circuit that stores a test result.

Furthermore, preferably, the semiconductor memory device according to the present invention further includes a defect test terminal that is connected to the amplifier control circuit and measures a current of the dummy cells.

With this configuration, a defect of a dummy cell can be detected securely by detecting an abnormal current value.

Furthermore, preferably, the semiconductor memory device according to the present invention further includes a defect-test terminal that is connected to the amplifier control circuit and measures an output timing of the amplifier startup signal.

With this configuration, a defect of a dummy circuit can be detected without applying a load for the test.

Furthermore, in the semiconductor memory device according to the present invention, it is preferable that the memory circuit includes a nonvolatile memory element and the nonvolatile memory element includes a fuse that can be disconnected with a laser.

DETAILED DESCRIPTION OF THE INVENTION

The following describes preferred embodiments of the present invention, with reference to the drawings.

Embodiment 1

Figure 1:
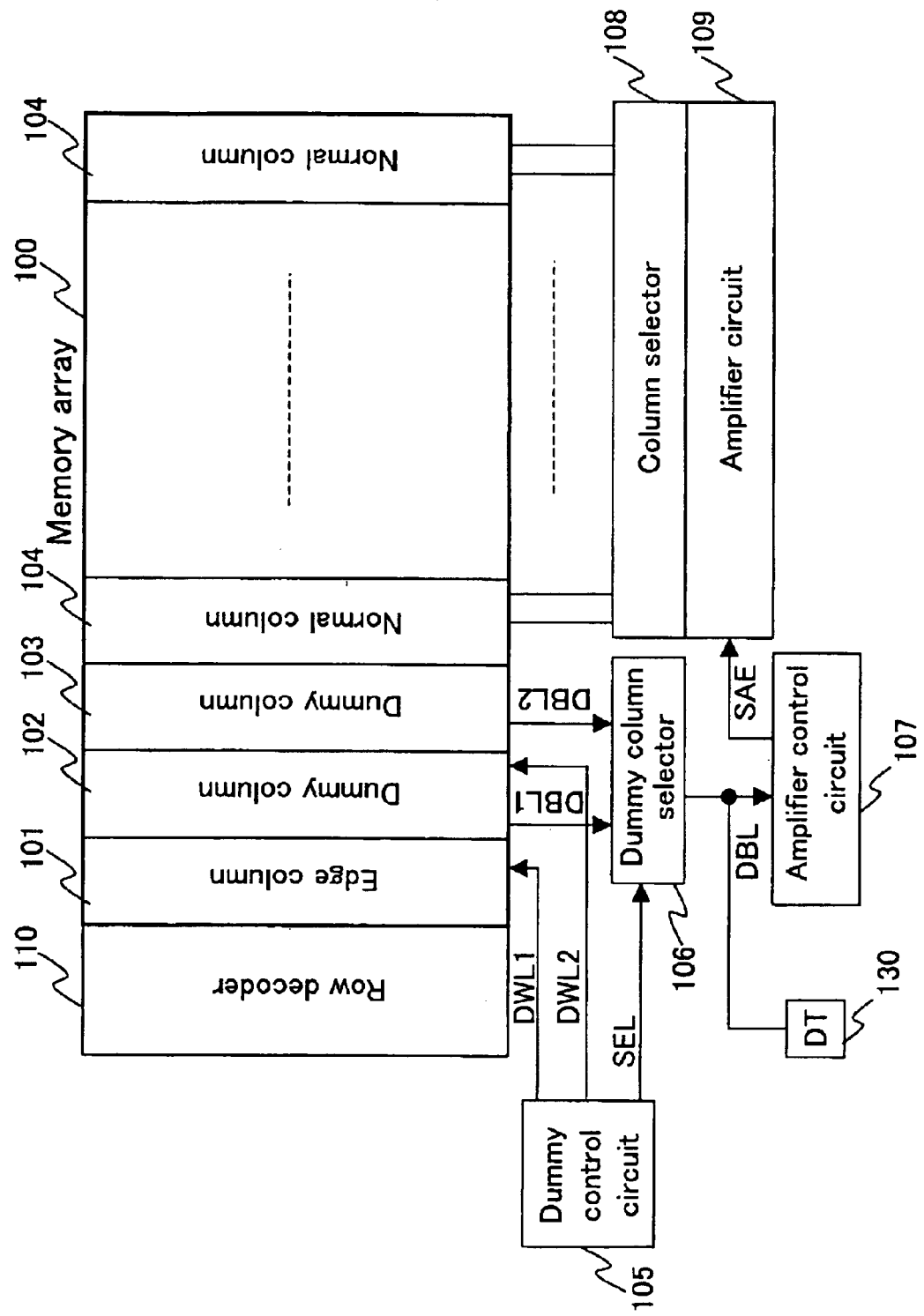
FIG. 1 shows an overall configuration of a semiconductor memory device according to Embodiment 1 of the present invention.

FIG. 1 shows an overall configuration of a semiconductor memory device according to Embodiment 1 of the present invention. In FIG. 1, reference numeral 100 denotes a memory array, 101 denotes an edge column included in the memory array 100, 102 and 103 denote dummy columns included in the memory array 100, and 104 denotes a plurality of normal columns included in the memory array 100, respectively. Herein, the normal columns refer to those columns other than the edge column and the dummy columns in the memory array 100.

A dummy column selector 106 connected to the dummy columns 102 and 103 is controlled by a dummy control circuit 105.

An output signal from a column selector 108 connected to the normal columns 104 and an amplifier startup signal SAE that is an output signal from an amplifier control circuit 107 connected to the dummy column selector 106 are input to an amplifier circuit 109.

Note here that reference numeral 110 denotes a row decoder connected to the memory array 100, and 130 denotes a defect test terminal for measuring a current value of a DBL signal that is an output signal from the dummy column selector 106, respectively.

Figure 2:
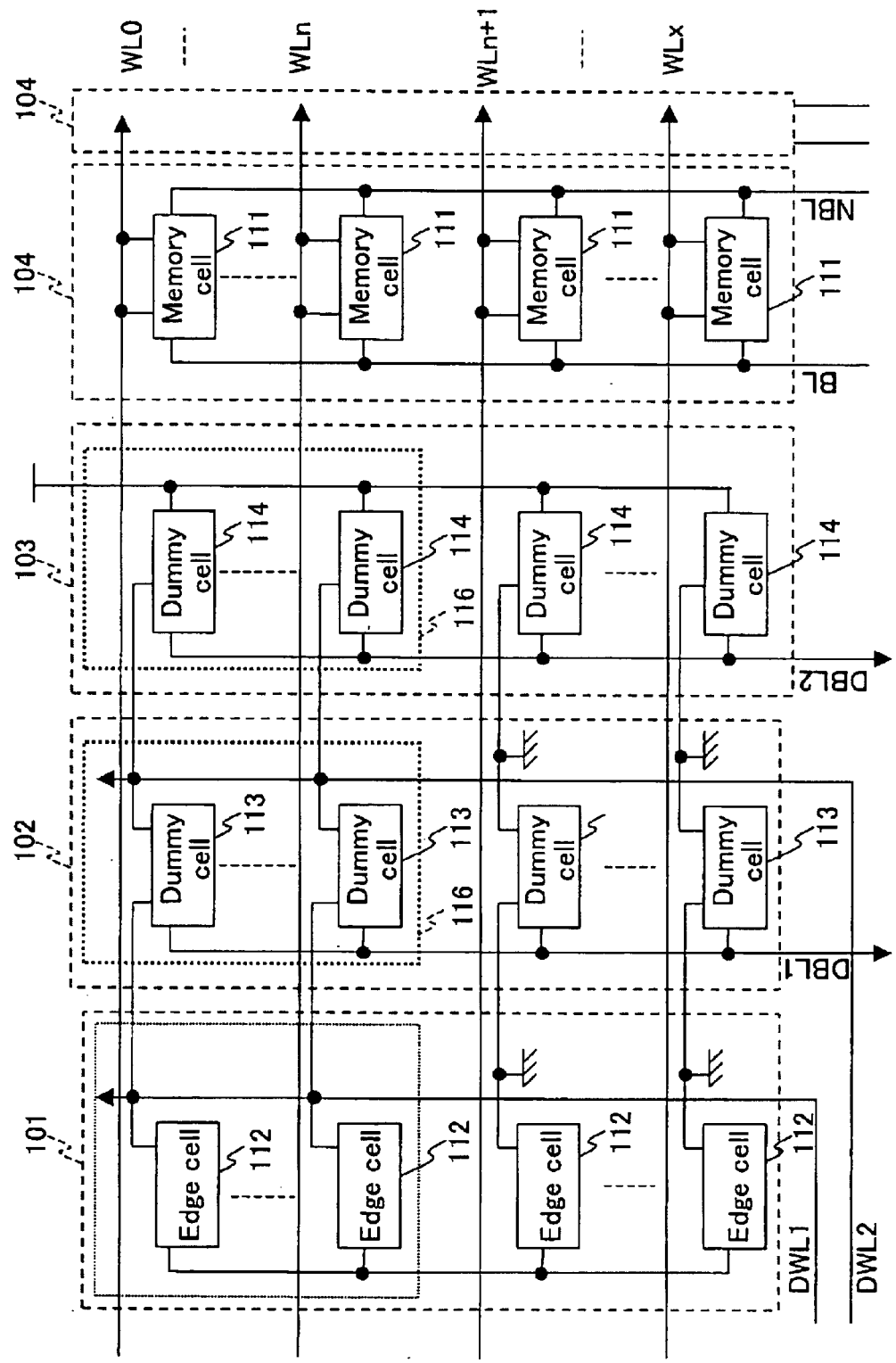
FIG. 2 shows an internal configuration of the memory array shown in FIG. 1.
Figure 3:
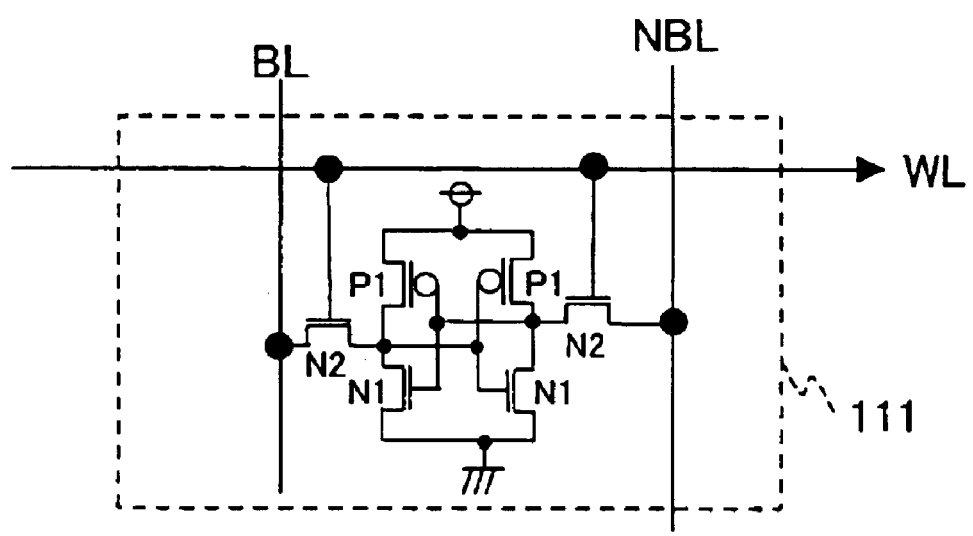
FIG. 3 shows an internal configuration of a normal memory cell shown in FIG. 2.

FIG. 2 shows a partial configuration of the memory array 100 shown in FIG. 1. In FIG. 2, reference numeral 111 denotes memory cells included in the normal column 104, and SRAMs are intended for this embodiment. FIG. 3 shows an internal configuration of a single memory cell 111 shown in FIG. 2.

Figure 4:
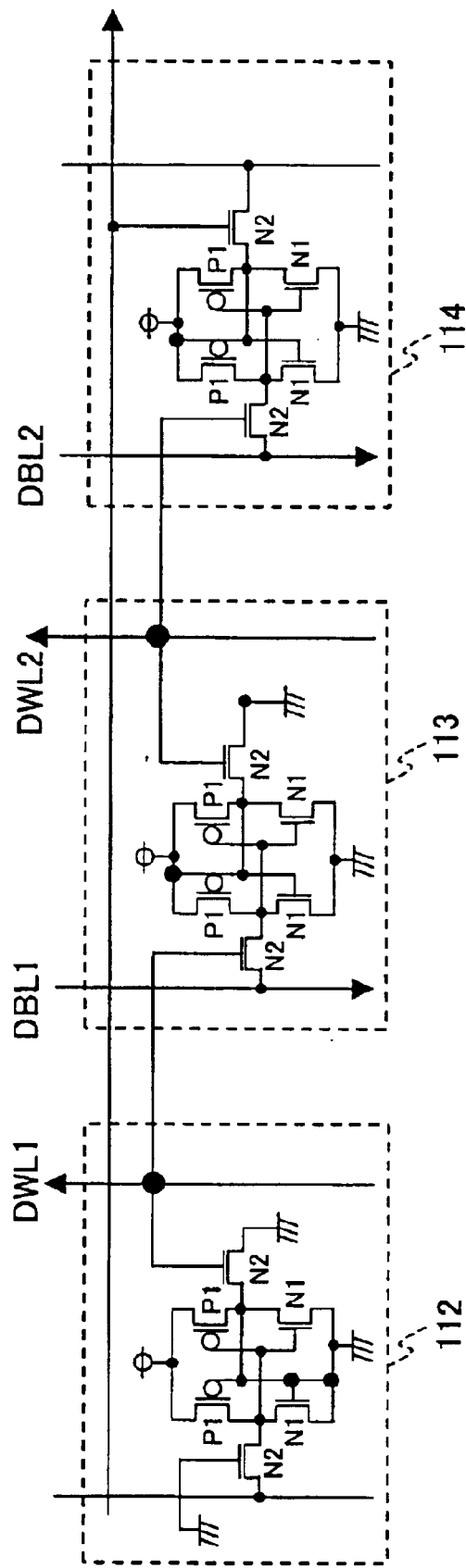
FIG. 4 shows internal configurations of the edge cell and the dummy cells shown in FIG. 2.

Furthermore, reference numeral 112 denotes edge cells included in the edge column 101, 113 denotes dummy cells included in the dummy column 102, and 114 denotes dummy cells included in the dummy column 103, respectively. FIG. 4 shows internal configurations of the edge cell 112 and the dummy cells 113 and 114 shown in FIG. 2 and an interconnection configuration therebetween.

As shown in FIG. 4, transistors constituting the edge cell 112 and the dummy cells 113 and 114 have the same size as that of transistors constituting the memory cell 111, and latches included in the edge cell 112 and the dummy cells 113 and 114 are fixed at a constant level.

Figure 5:
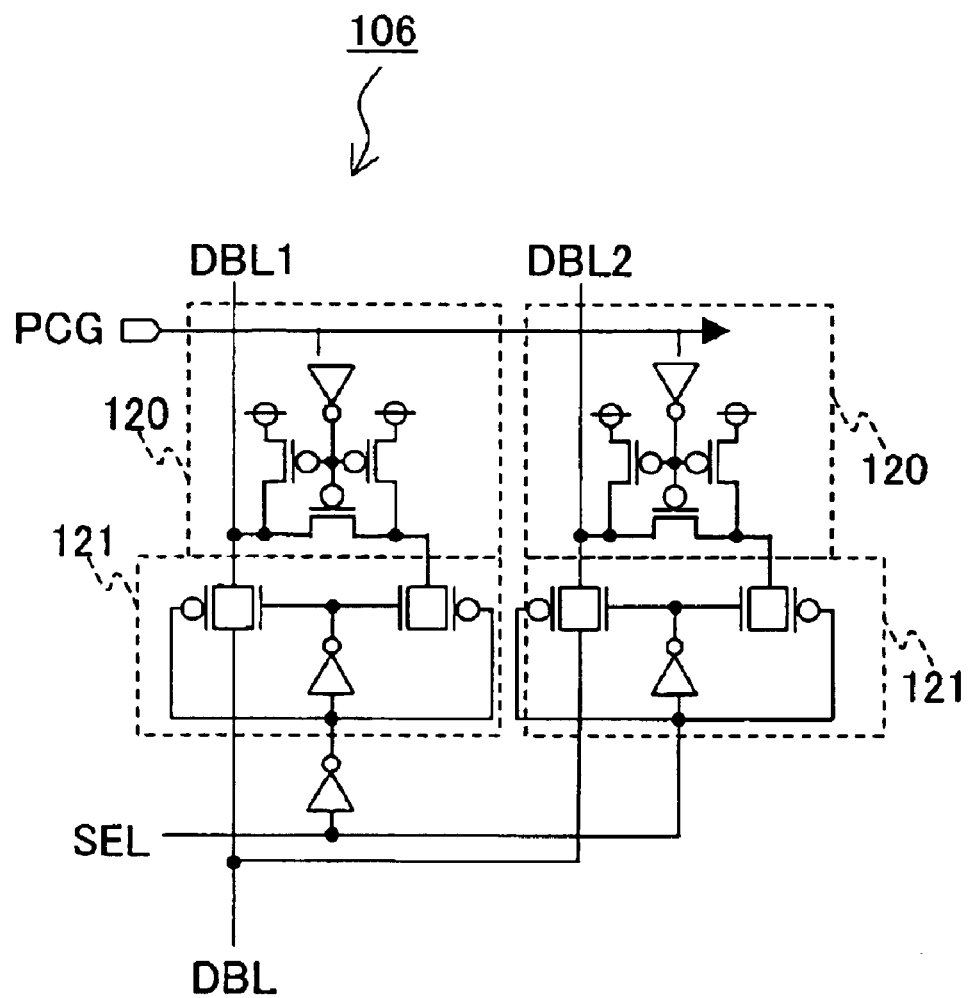
FIG. 5 shows an internal configuration of the dummy column selector shown in FIG. 1.

FIG. 5 shows an internal configuration of the dummy column selector 106 shown in FIG. 1. In FIG. 5, a bit line precharge circuit 120 receives a precharge signal PCG so as to precharge dummy bit lines DBL1 and DBL2. Reference numeral 121 denotes a transfer gate.

Figure 6:
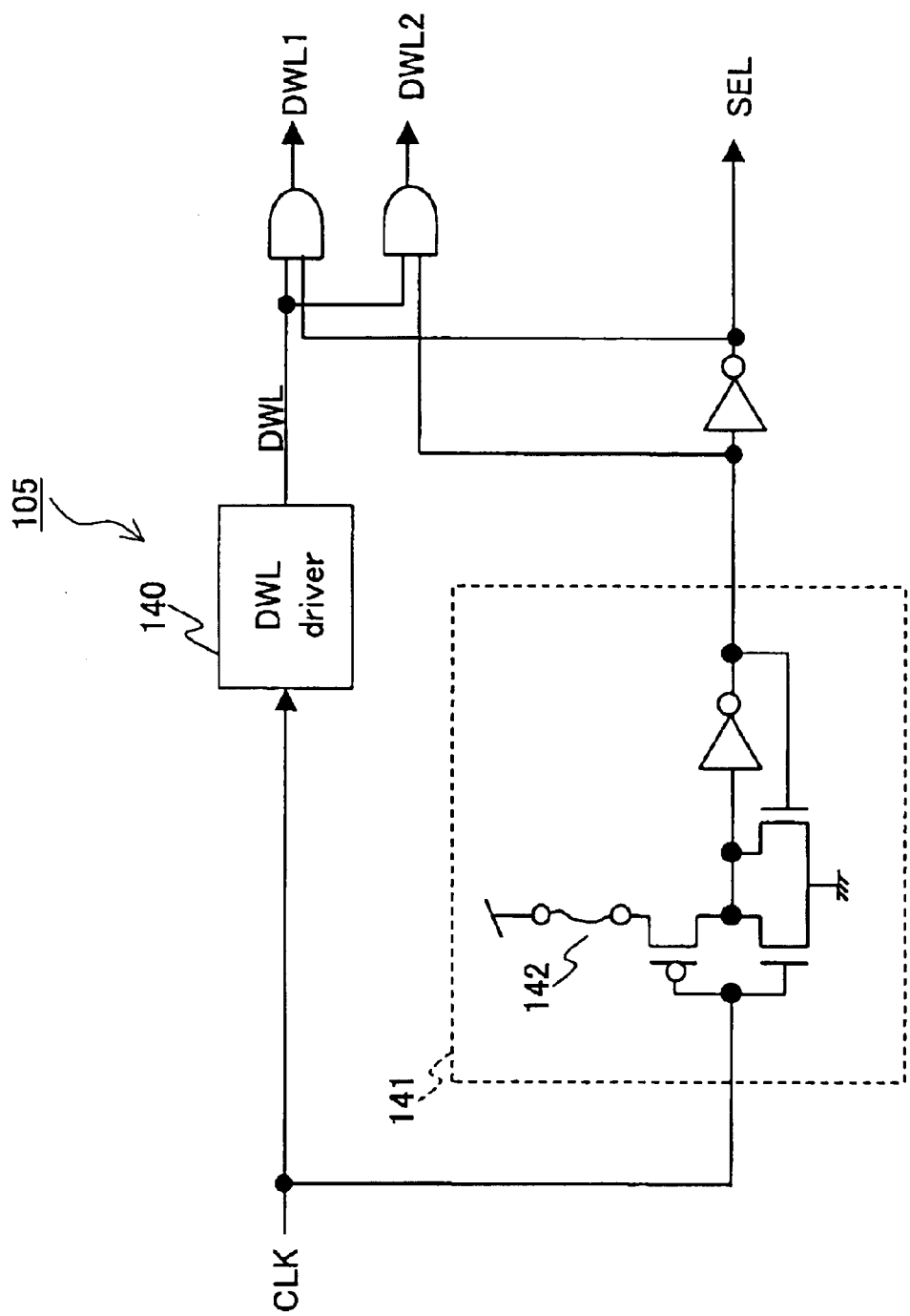
FIG. 6 shows an internal configuration of the dummy control circuit shown in FIG. 1.

FIG. 6 partially shows an internal configuration of the dummy control circuit 105 shown in FIG. 1. In FIG. 6, reference numeral 140 denotes a dummy word line driver that receives a memory access signal CLK and outputs a dummy word line driving signal DWL. Reference numeral 141 denotes a memory circuit of a test result, which receives a memory access signal CLK and generates a dummy cell selection signal SEL. Reference numeral 142 denotes a nonvolatile memory element, which is made up of a fuse element.

As shown in FIG. 2, the memory cells 111 in the normal column 104 respectively are connected to word lines WL0 to WLx on an output side of the row decoder 110 in a row direction, and are connected to common bit lines BL and NBL of the normal column 104 in a column direction.

Furthermore, among the plurality of edge cells 112, the plurality of dummy cells 113 and the plurality of dummy cells 114, n edge cells 112, n dummy cells 113 within an area defined by 116 and n dummy cells 114 within an area defined by 116 are placed on the memory array 100 at positions farthest in a column direction from the side where the amplifier circuit 109 is placed and are connected to a dummy word line DWL1 or DWL2 that is connected to the dummy control circuit 105. The other edge cells 112 and dummy cells 113 and 114 are connected to a ground line.

Note here that as wirings of the dummy word lines DWL1 and DWL2 in the memory array 100, wirings corresponding to the bit line wiring in the normal column 104 are used.

Furthermore, the plurality of dummy cells 113 and 114 respectively are connected to common dummy bit lines DBL1 and DBL2, and the dummy bit lines DBL1 and DBL2 are connected to the dummy column selector 106.

When the memory array 100 is accessed from the outside, any one of the word lines WL0 to WLx connected to the row decoder 110 is selected, and data in the memory cell 111 is read out onto the bit lines BL and NBL. The bit lines BL and NBL in the normal column 104 and the dummy bit lines DBL1 and DBL2 in the dummy columns 102 and 103 are precharged in advance to a high level by the bit line precharge circuit 120 so as to be in a floating state at the time when the word lines WL0 to WLx are selected. Since there are a plurality of normal columns 104, a plurality of pieces of data are read out onto the respective bit lines BL and NBL, and data in particular bit lines BL and NBL are selected by the column selector 108.

At almost the same timing when the word lines WL0 to WLx are selected, the dummy word line DWL1 or DWL2 connected to the dummy control circuit 105 is driven, and transistors constituting the n dummy cells 113 in the case where the dummy word line DWL1 is driven and transistors constituting the n dummy cells 114 in the case where the dummy word line DWL2 is driven, respectively, allow a potential of the dummy bit line DBL1 and the dummy bit line DBL2 to change from a high level to a low level at a slew rate that is n times that of the memory cell 111.

Then, the dummy column selector 106 selects a dummy bit line to be changed to a low level between the dummy bit line DBL1 and DBL2 based on the dummy cell selection signal SEL as an output signal from the dummy control circuit 105, and transfers a DBL signal to the amplifier control circuit 107. When the DBL signal reaches a predetermined level, the amplifier control circuit 107 generates an amplifier startup signal SAE, and the amplifier circuit 109 amplifies data in the particular bit lines BL and NBL selected by the column selector 108, based on the amplifier startup signal SAE.

In the above-described operation, the selection between the dummy word lines DWL1 and DWL2 and between the dummy bit lines DBL1 and DBL2, which are provided with redundancy, is performed by the dummy control circuit 105 in accordance with the following procedure.

First, a current of the dummy cells 113 is measured with the defect test terminal 130. If the measured current value is within an acceptable range with respect to a previously set value, the fuse element 142 included in the memory circuit 141 shown in FIG. 6 is not disconnected, which means a state where the dummy word line DWL1 and the dummy bit line DBL1, which are connected to the dummy cells 113, are selected.

Alternatively, if the current value measured with the defect test terminal 130 is beyond the acceptable range, the fuse element 142 is disconnected with a laser or the like, which means a state where the dummy word line DWL2 and the dummy bit line DBL2, which are connected to the dummy cells 114, are selected.

In this way, a current value of the dummy cells 113 or 114 is measured with the defect test terminal 130 so as to confirm that the current value is within the acceptable range with respect to the previously set value, thus determining which dummy word line and which dummy bit line should be selected. Therefore, even when an abnormal current value is detected, that is, there is a defect in a dummy cell, this configuration allows for readily switching to the other dummy word line and dummy bit line.

As stated above, according to this embodiment, the column selector, which is not placed in the dummy circuit in the conventional configuration, is placed as a dummy column selector so as to be connected to the dummy bit lines, and the dummy cells driving the dummy bit lines are placed at positions farthest in a column direction from the side where the amplifier circuit is placed on the memory array. This configuration allows a timing for driving the bit lines by the memory cells that are placed similarly at positions farthest from the amplifier circuit to be simulated accurately, thus enabling the generation of an amplifier startup signal without delay.

Furthermore, in the case where there is a defect in a dummy cell, the plurality of dummy columns arranged allow for readily switching from a dummy column including the dummy cell with the defect to a normal dummy column. This can improve the production yield of a semiconductor memory device as well.

Embodiment 2

Figure 7:
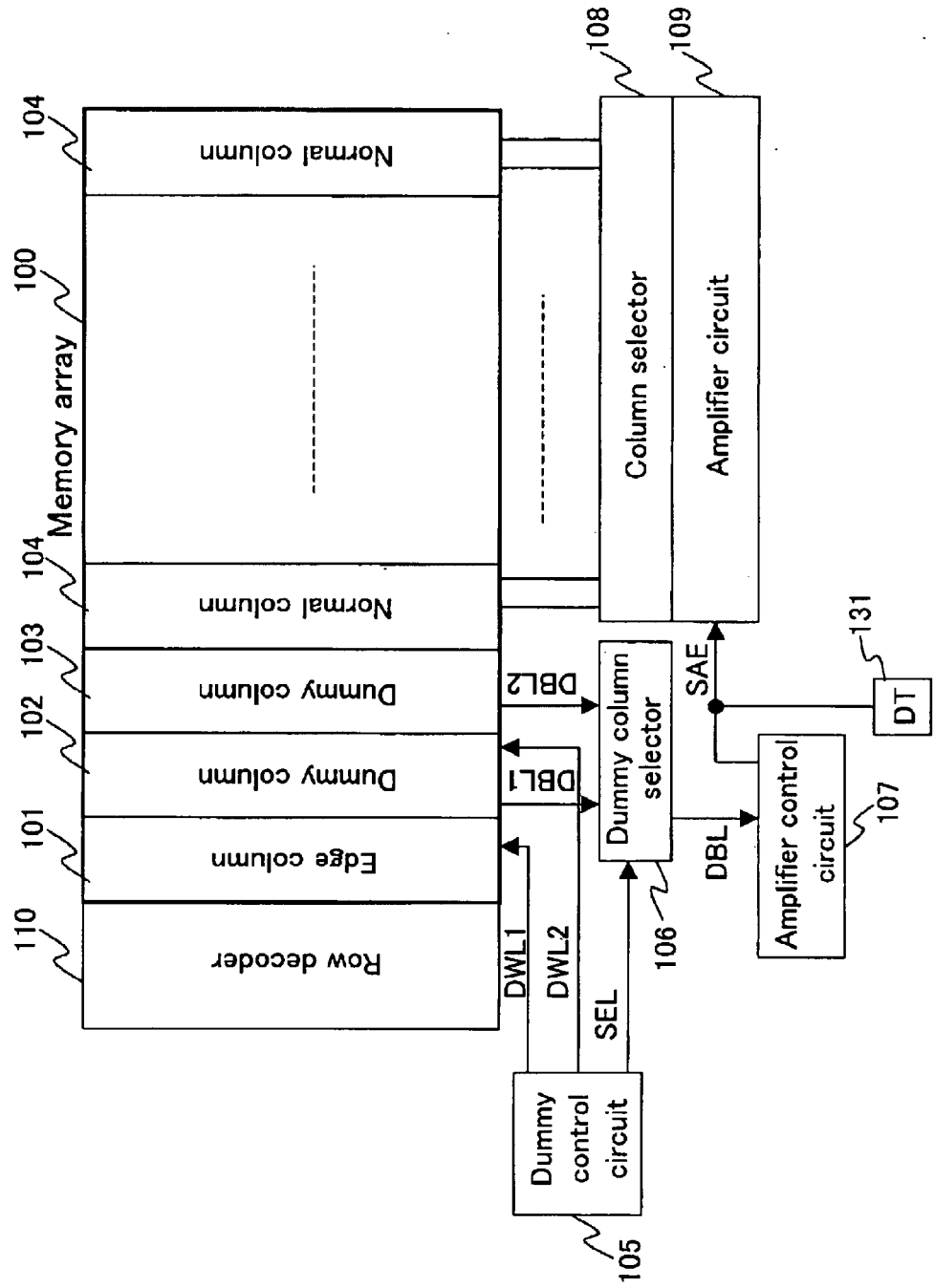
FIG. 7 shows an overall configuration of a semiconductor memory device according to Embodiment 2 of the present invention.

FIG. 7 shows an overall configuration of a semiconductor memory device according to Embodiment 2 of the present invention. In FIG. 7, reference numeral 131 denotes a defect test terminal for measuring a timing of an amplifier startup signal SAE. The remaining configuration is similar to that of Embodiment 1, and therefore the same reference numerals as those of FIG. 1 will be assigned and their detailed explanations omitted.

The feature of this embodiment resides in that, during test, a generation timing of an amplifier startup signal is measured with a defect test terminal 131. That is to say, in the case where the generation timing of the amplifier startup signal SAE measured with the defect test terminal 131, based on a signal of a dummy bit line DBL1 driven by the dummy cells 113, is within an acceptable range with respect to a previously set timing, a fuse element 142 included in a memory circuit 141 shown in FIG. 6 is not disconnected, so that a dummy word line DWL1 and a dummy bit line DBL1 are selected.

Alternatively, in the case where the generation timing of the amplifier startup signal SAE measured with the defect test terminal 131, based on a signal of the dummy bit line DBL1 driven by the dummy cells 113, is beyond the acceptable range with respect to the previously set timing, the fuse element 142 is disconnected with a laser or the like, so that a dummy word line DWL2 and a dummy bit line DBL2 are selected.

This configuration allows the switching of dummy word lines and dummy bit lines by measuring the generation timing of the amplifier startup signal SAE with the defect test terminal 131 and by confirming that the generation timing is within the acceptable range with respect to the previously set timing.

As stated above, according to this embodiment, a defect of a dummy circuit including dummy cells can be inspected without adding a load for the test in the dummy bit lines, thus allowing a timing of driving the bit lines by memory cells to be simulated with increased accuracy.

Embodiment 3

Figure 8:
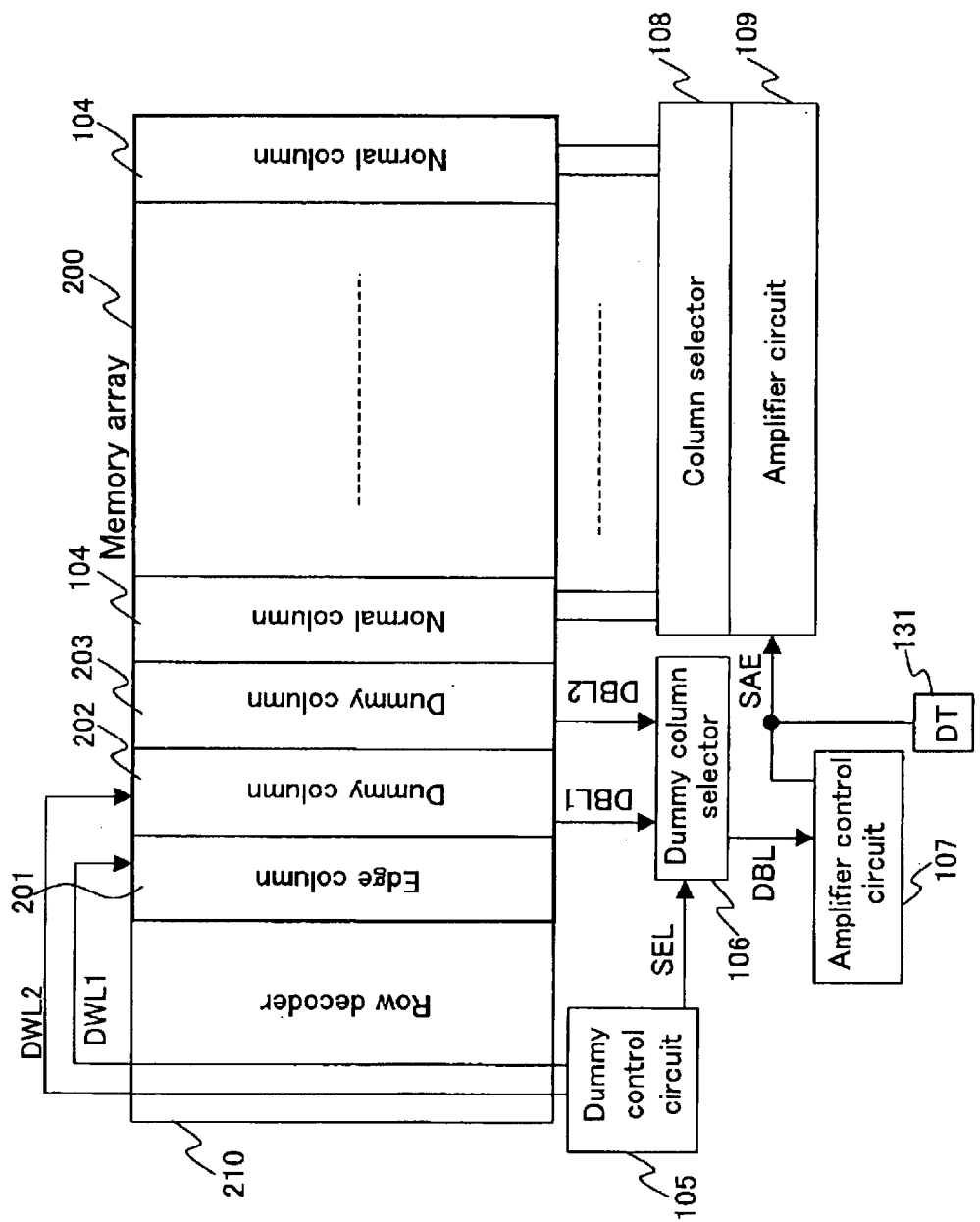
FIG. 8 shows an overall configuration of a semiconductor memory device according to Embodiment 3 of the present invention.

FIG. 8 shows an overall configuration of a semiconductor memory device according to Embodiment 3 of the present invention. In FIG. 8, reference numeral 200 denotes a memory array, 201 denotes an edge column included in the memory array 200, and 202 and 203 denote dummy columns included in the memory array 200, respectively. Furthermore, reference numeral 210 denotes a row decoder.

The feature of this embodiment resides in that dummy word lines DWL1 and DWL2 on an output side of a dummy control circuit 105 are provided by way of the inside of the row decoder 210, and are connected to the edge column 201 and the dummy columns 202 and 203 with respect to the memory array 200 from an opposite side to a side where an amplifier circuit 109 is placed.

The remaining configuration is similar to that of Embodiment 2, and therefore the same reference numerals as those of FIG. 7 will be assigned and their detailed explanations omitted.

Figure 9:
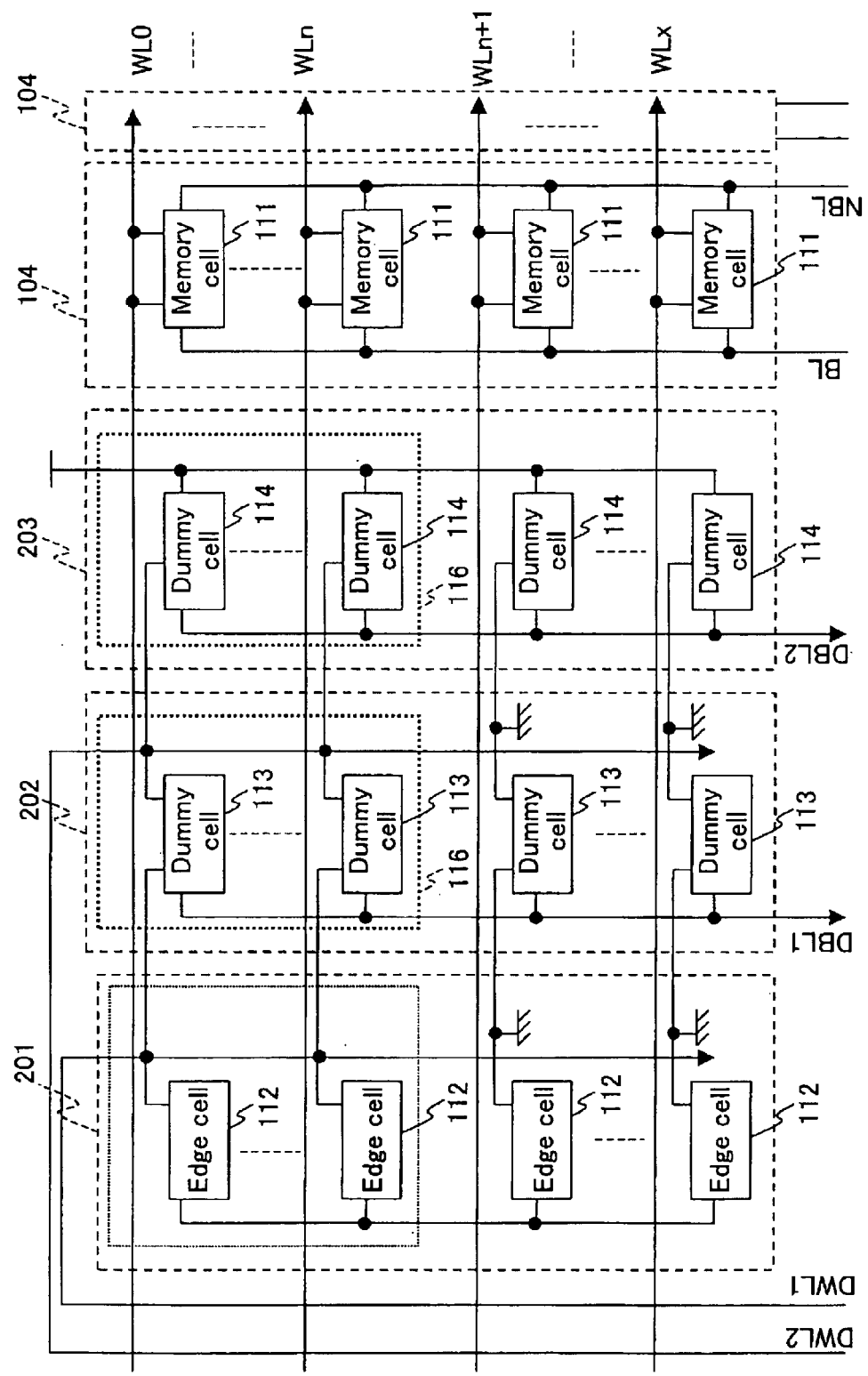
FIG. 9 shows an internal configuration of the memory array shown in FIG. 8.

FIG. 9 shows an internal configuration of the memory array 200 shown in FIG. 8. As shown in FIG. 9, the dummy word lines DWL1 and DWL2 are connected to the edge column 201 and the dummy columns 202 and 203 from the side opposite to the side where the amplifier 109 is placed. The remaining configuration is similar to the configuration of the memory array 100 in Embodiment 1 shown in FIG. 2.

With this configuration, consideration can be given to wiring loads due to the dummy word lines, which are not considered conventionally.

That is to say, according to this embodiment, the wiring of the dummy word lines is carried out under the same conditions as those on the wiring on the row decoder on which the wiring is carried out so as to drive normal word lines, and therefore the wiring loads on the row decoder can be simulated accurately, thus allowing a dummy circuit with increased accuracy to be configured.

Embodiment 4

Figure 10:
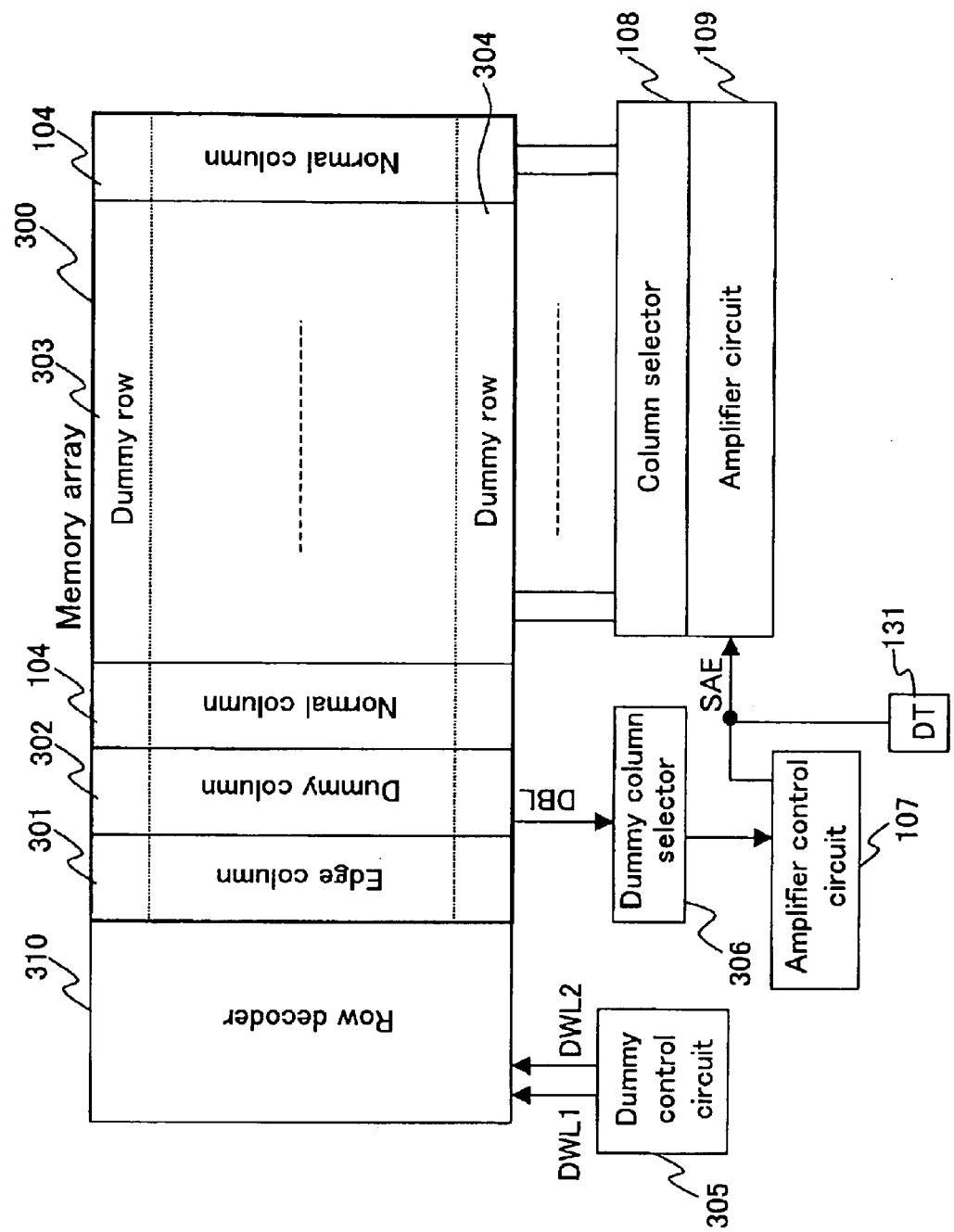
FIG. 10 shows an overall configuration of a semiconductor memory device according to Embodiment 4 of the present invention.

FIG. 10 shows an overall configuration of a semiconductor memory device according to Embodiment 4 of the present invention. In FIG. 10, reference numeral 300 denotes a memory array, 301 denotes an edge column included in the memory array 300, 302 denotes a dummy column included in the memory array 300, and 303 and 304 denote dummy rows included in the memory array 300, respectively. Furthermore, reference numeral 305 denotes a dummy control circuit, 306 denotes a dummy column selector, and 310 denotes a row decoder, respectively. Dummy word lines DWL1 and DWL2 connected to the dummy control circuit 305 are connected to the row decoder 310. Furthermore, a dummy bit line DBL on an output side of the dummy column 302 is connected to the dummy column selector 306.

The remaining configuration is similar to that of Embodiment 2, and therefore the same reference numerals as those of FIG. 7 will be assigned and their detailed explanations omitted.

Figure 11:
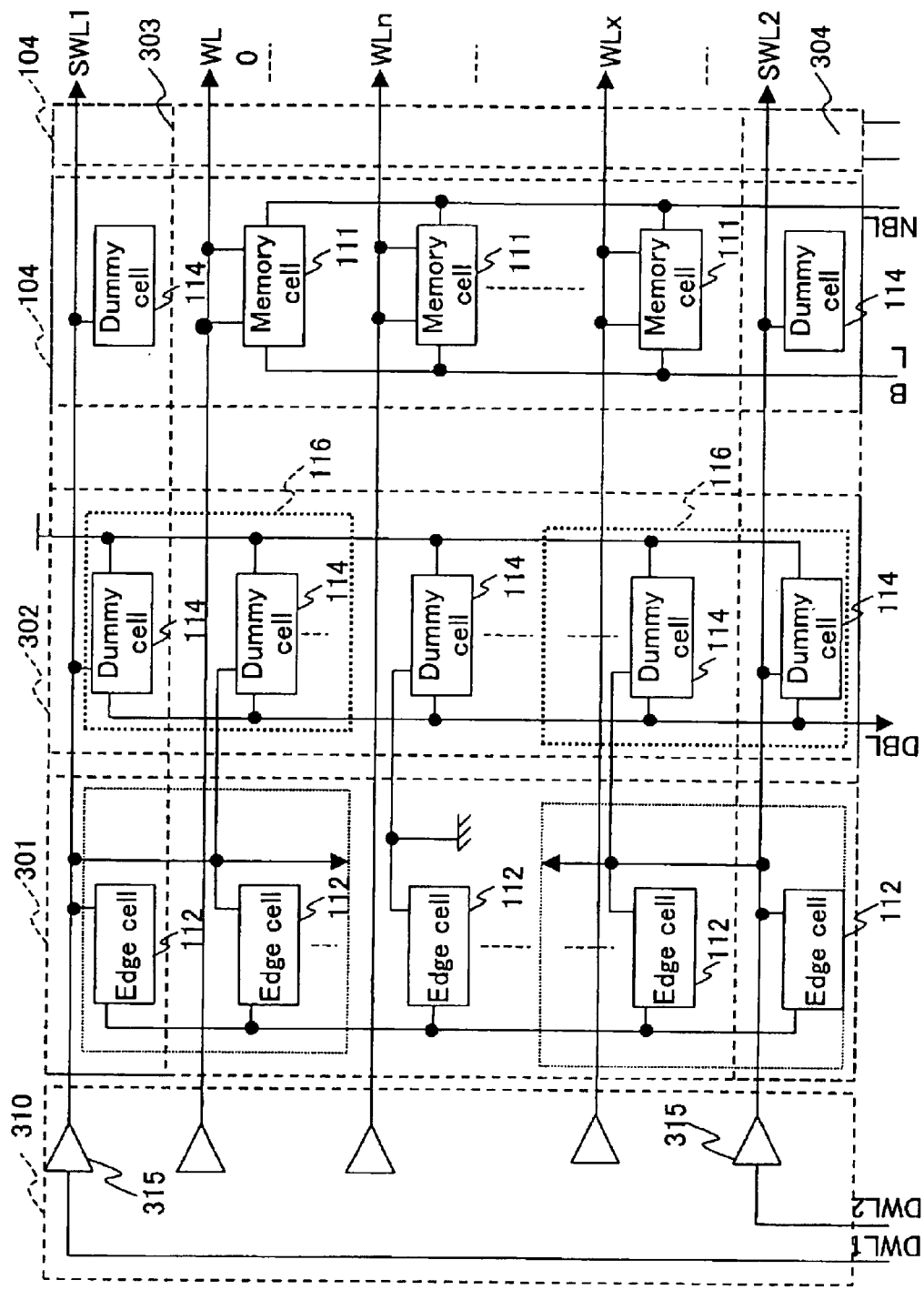
FIG. 11 shows an internal configuration of the memory array shown in FIG. 10.

FIG. 11 shows an internal configuration of the memory array 300 shown in FIG. 10. In FIG. 11, reference numeral 315 denotes drivers that respectively drive word lines SWL1 and SWL2 located on the dummy rows 303 and 304.

Furthermore, reference numeral 116 denotes dummy cells selected by the dummy word lines DWL1 and DWL2, respectively, among a plurality of dummy cells 114 placed on the dummy column 302, that is, a plurality of dummy cells driving the dummy bit line DBL.

Figure 12:
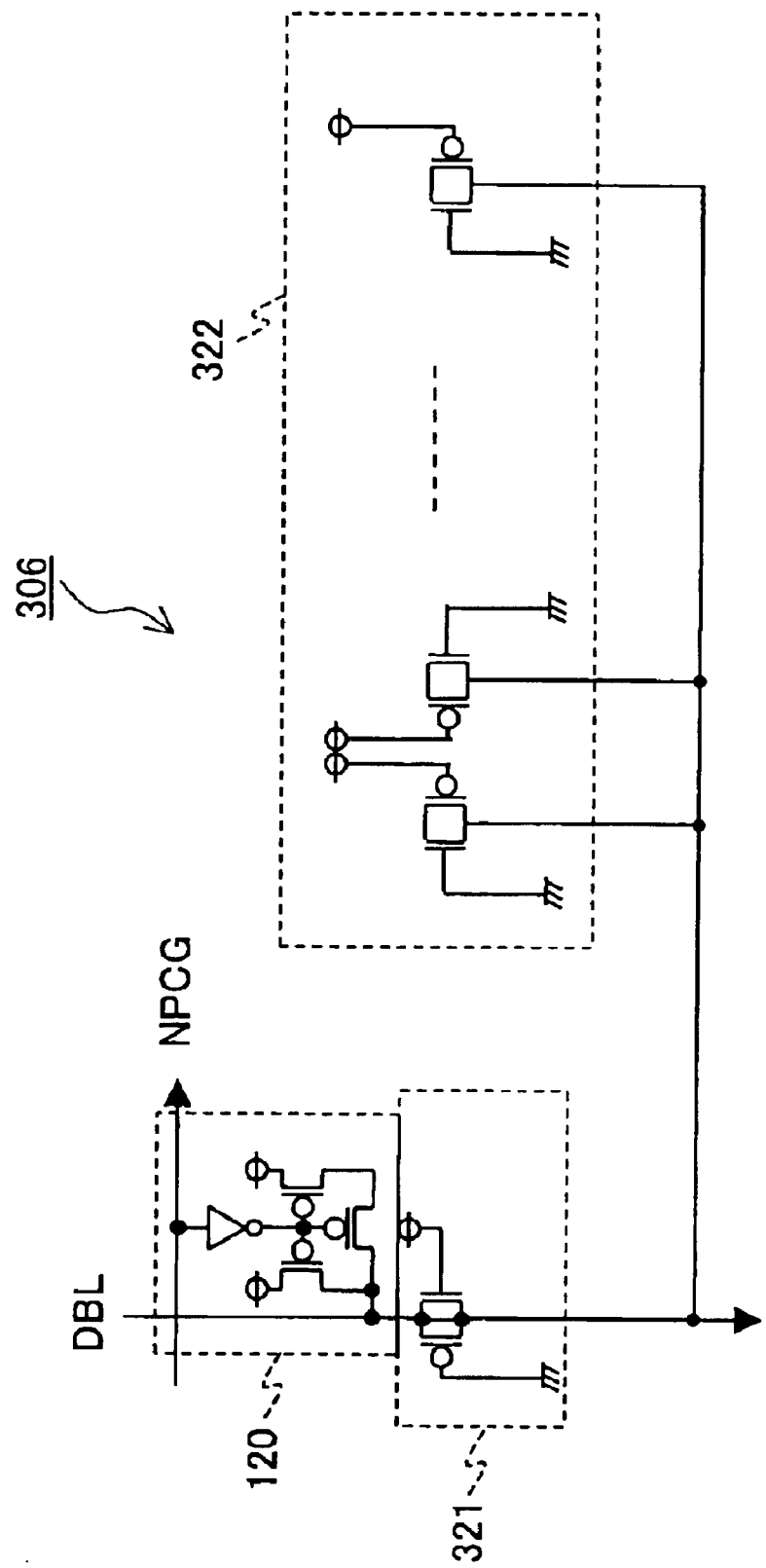
FIG. 12 shows an internal configuration of the dummy column selector shown in FIG. 10.

FIG. 12 shows an internal configuration of the dummy column selector 306 shown in FIG. 10. In FIG. 12, reference numeral 321 denotes a transfer gate, which is connected to the dummy bit line DBL on an output side of the dummy column 302.

Note here that sources and drains of transistors constituting the transfer gate 321 are short-circuited. This can prevent an output signal to the amplifier control circuit 107 from being delayed considerably, which results from a deterioration of a transistor current ability of the transfer gate 321 when the dummy bit line DBL changes to about a half level of a power supply voltage during a low voltage applied.

Furthermore, reference numeral 322 denotes a plurality of transfer gates, where the total number of the transfer gates 321 and 322 is equal to the number of transfer gates for selecting a set of BL and NBL from the plurality of bit lines BL and NBL by the column selector 108. With this configuration, a dummy circuit with further increased accuracy can be configured.

As stated above, according to this embodiment, a plurality of dummy cells 114 for driving the dummy bit line DBL are placed on the same dummy column 302, whereby the number of the dummy column itself can be reduced, thus enabling a reduction in an area of the memory array.

Embodiment 5

Figure 13:
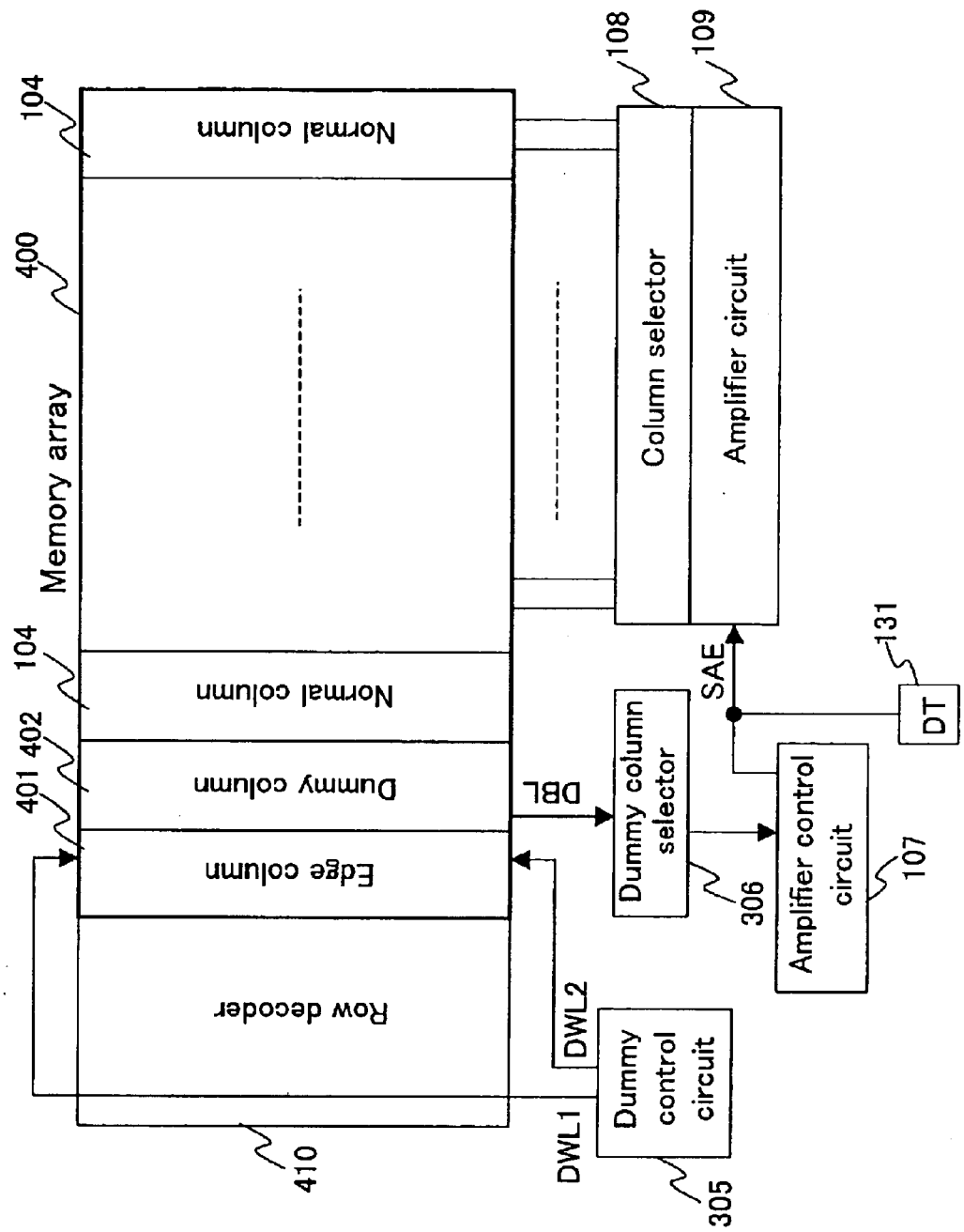
FIG. 13 shows an overall configuration of a semiconductor memory device according to Embodiment 5 of the present invention.

FIG. 13 shows an overall configuration of a semiconductor memory device according to Embodiment 5 of the present invention. In FIG. 13, reference numeral 400 denotes a memory array, 401 denotes an edge column included in the memory array 400, 402 denotes a dummy column included in the memory array 400, and 410 denotes a row decoder, respectively.

The remaining configuration is similar to that of Embodiment 4, and therefore the same reference numerals as those of FIG. 10 will be assigned and their detailed explanations omitted.

The feature of this embodiment resides in that a dummy word line DWL1 on an output side of a dummy control circuit 305 is input to the dummy column 401 with respect to the memory array 400 from an opposite side to a side where an amplifier circuit 109 is placed, and a dummy word line DWL2 is input to the edge column 401 and the dummy column 402 from the same side as the side where the amplifier circuit 109 is placed.

Figure 14:
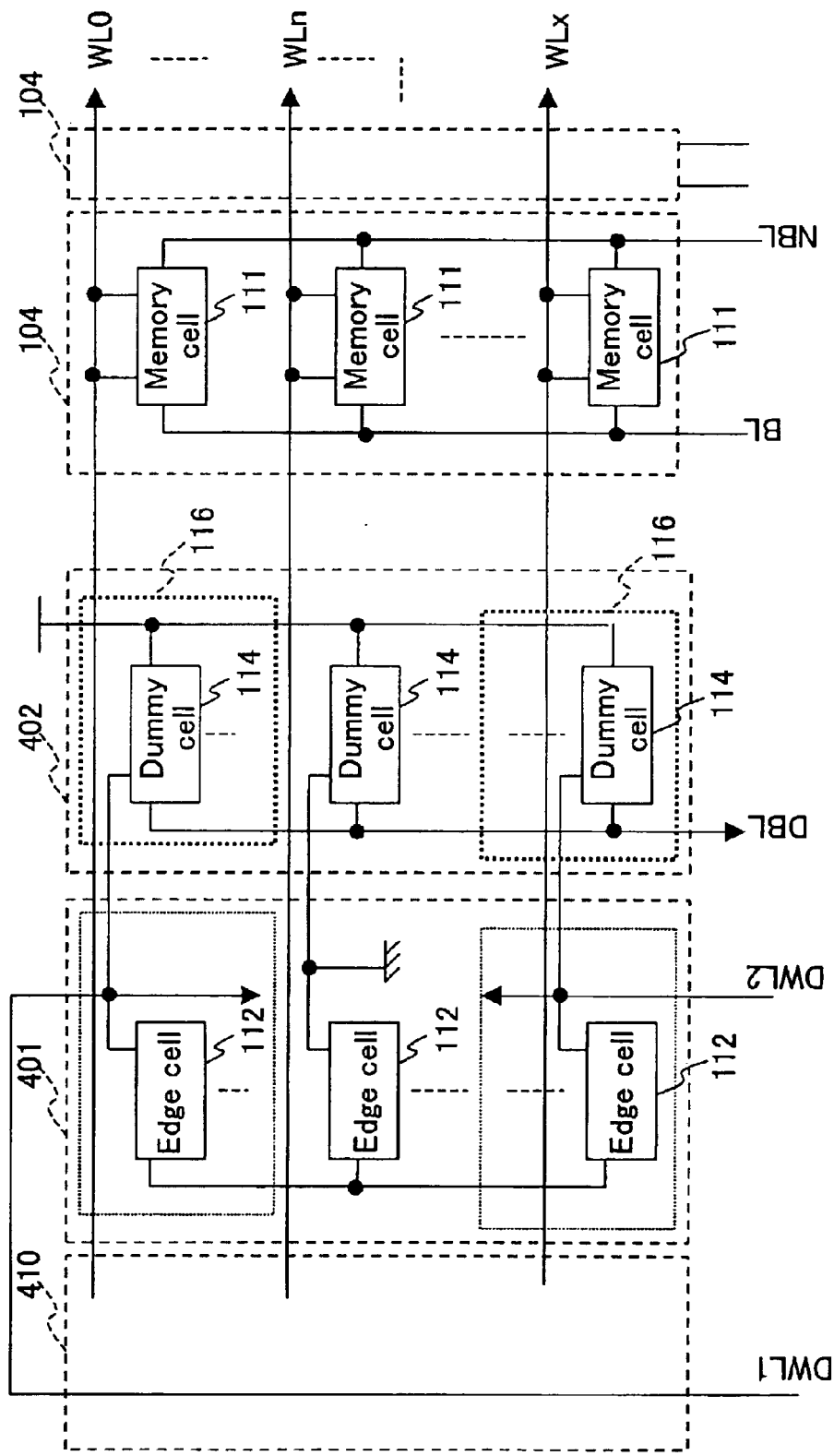
FIG. 14 shows an internal configuration of the memory array shown in FIG. 13.
Figure 15:
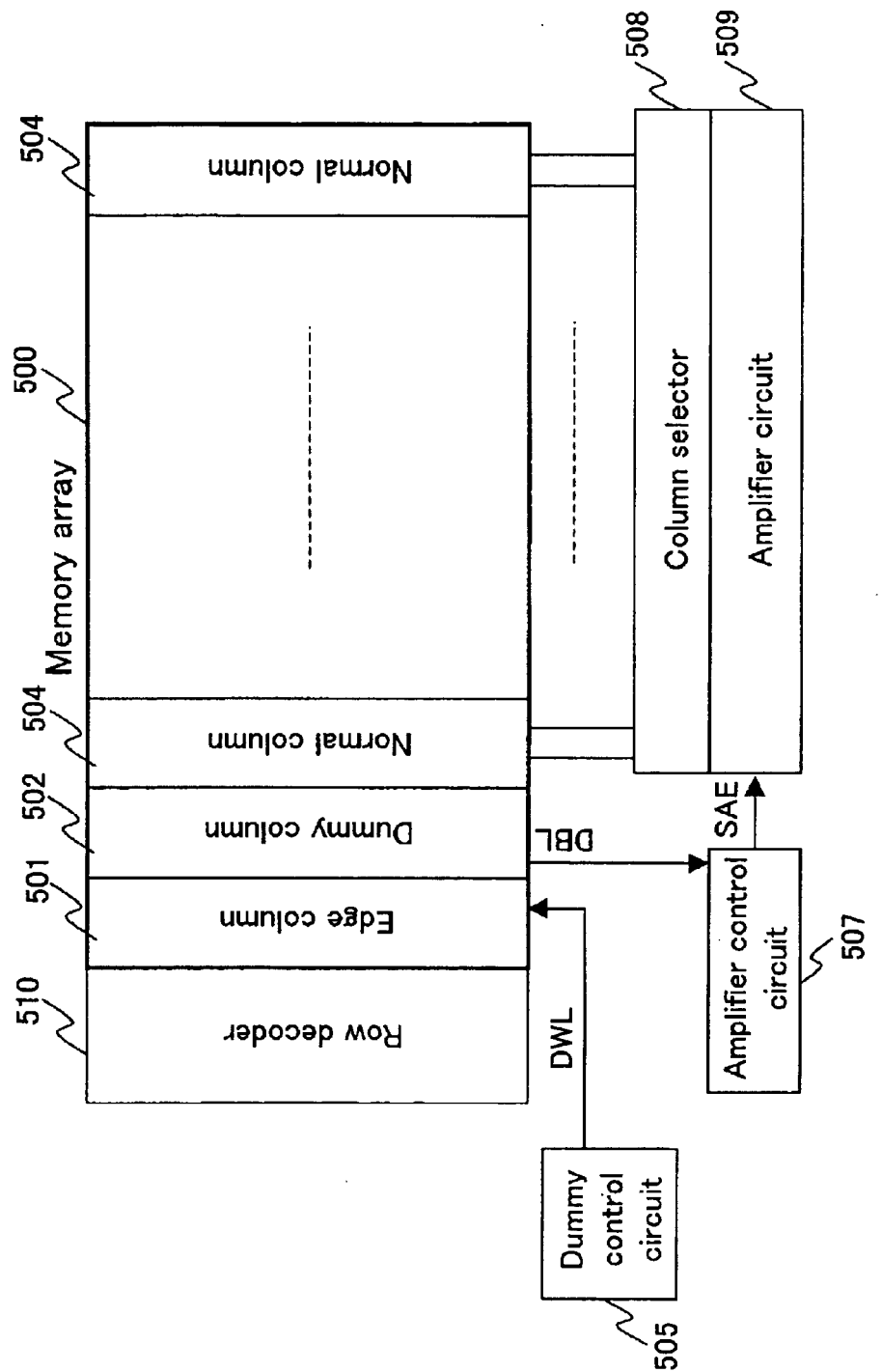
FIG. 15 shows an overall configuration of a conventional semiconductor memory device.
Figure 16:
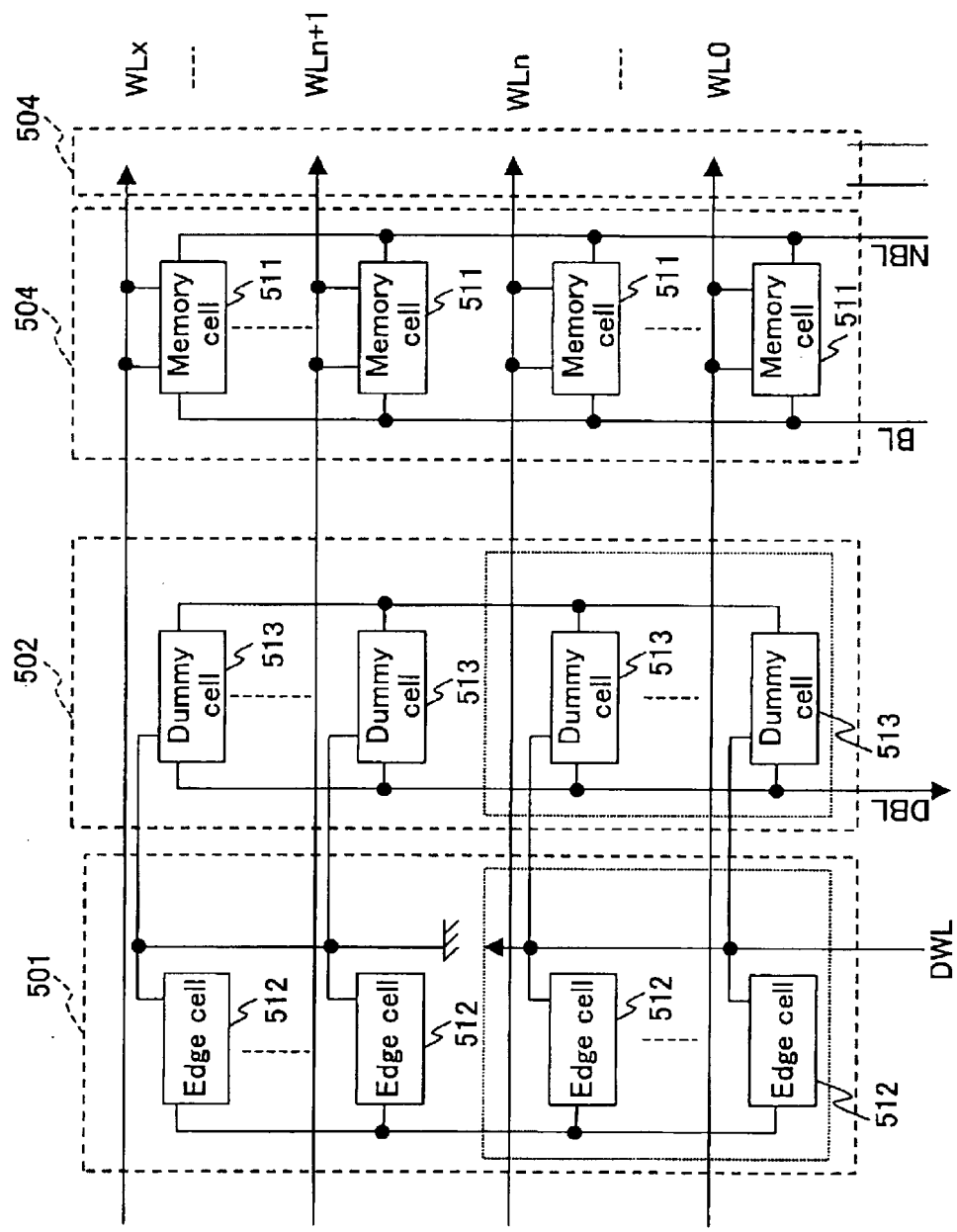
FIG. 16 shows an internal configuration of the memory array shown in FIG. 15.
Figure 17:
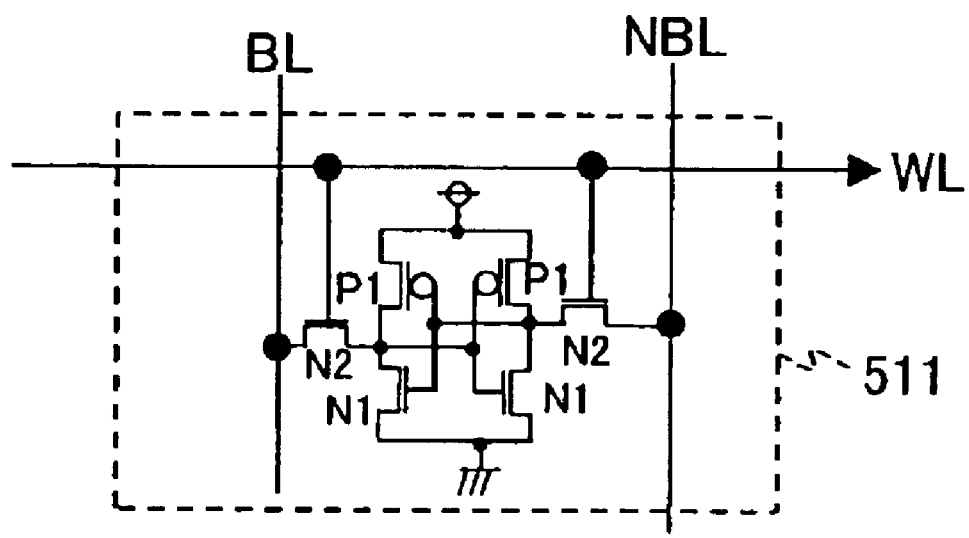
FIG. 17 shows an internal configuration of a normal memory cell shown in FIG. 16.
Figure 18:
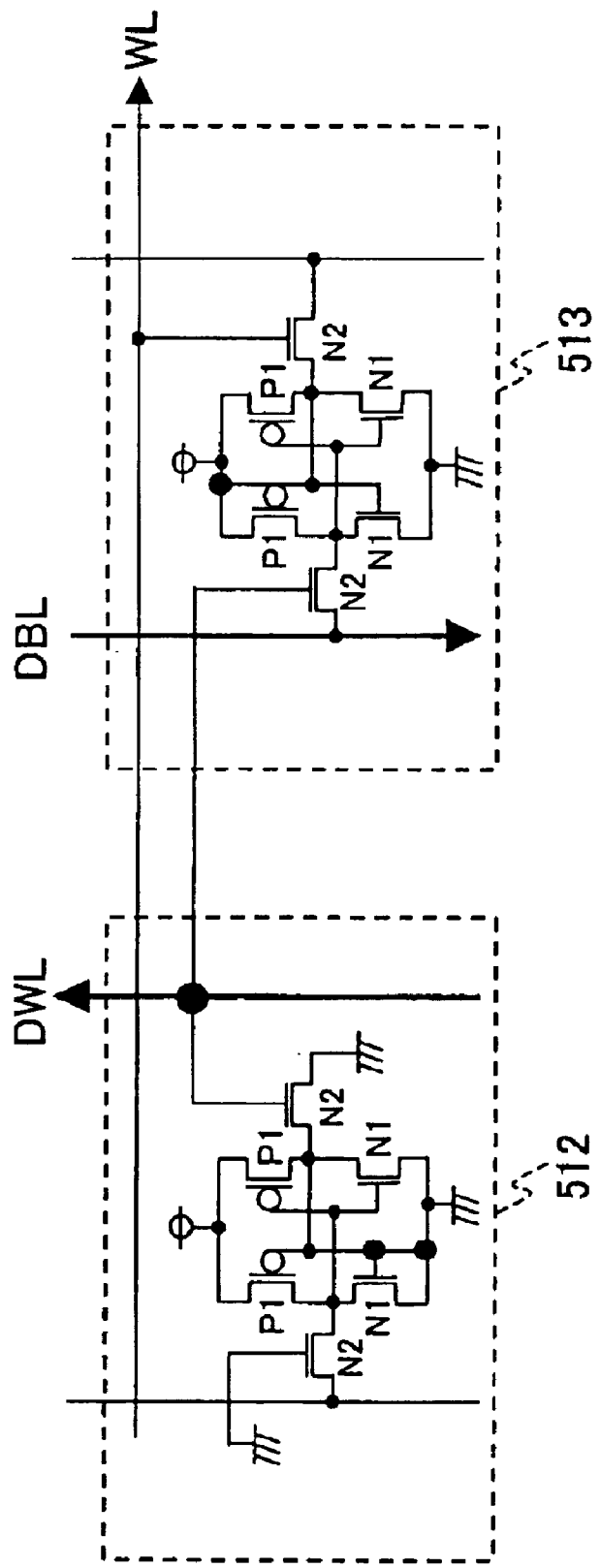
FIG. 18 shows internal configurations of the edge cell and the dummy cell shown in FIG. 16.

FIG. 14 shows an internal configuration of the memory array 400 shown in FIG. 13. In FIG. 14, the dummy word lines DWL1 and DWL2 are connected to different edge cells 112 and dummy cells 114, respectively, from opposite sides with respect to the edge column 401 and the dummy column 402.

In this way, according to this embodiment, there is no need of providing a dummy row and a plurality of dummy cells for driving the dummy bit line DBL are placed on the same dummy column, whereby the number of the dummy column can be reduced, thus enabling a reduction in an area of the memory array itself.

As explained above, according to the present invention, the column selector is placed so as to be connected to the dummy bit lines, and the dummy cells driving the dummy bit lines are placed at positions farthest in a column direction from the side where the amplifier circuit is placed on the memory array. This configuration allows a timing for driving the bit lines by the memory cells that are placed similarly at positions farthest from the amplifier circuit to be simulated accurately, thus enabling the generation of an amplifier startup signal without delay.

Furthermore, in the case where there is a defect in a dummy cell, the plurality of dummy columns arranged allow for readily switching from a dummy column including the dummy cell with the defect to a normal dummy column. This can improve the production yield of a semiconductor memory device as well.

What is claimed is:

1. A semiconductor memory device, comprising:

a memory array comprising a plurality of memory cells and a plurality of dummy cells;

a row decoder connected to the memory array;

a column selector that selects a normal column of the plurality of memory cells;

an amplifier circuit that amplifies data in the memory cell selected by the row decoder and the column selector;

a dummy control circuit that selectively activates, through a plurality of dummy word lines, at least one dummy cell among the plurality of dummy cells with respect to each of the dummy word lines;

a dummy column selector that selects a signal from the dummy cell activated by the dummy control circuit; and an amplifier control circuit that generates an amplifier startup signal for the amplifier circuit, based on the signal selected by the dummy column selector.

2. The semiconductor memory device according to claim 1, wherein the memory array comprises a plurality of dummy columns comprising the plurality of dummy cells and a plurality of dummy bit lines that are connected commonly to the plurality of dummy cells in the plurality of dummy columns, and the plurality of dummy bit lines are connected to the dummy column selector.

3. The semiconductor memory device according to claim 2,
wherein the plurality of dummy word lines are connected to the memory array from a same side as a side where the amplifier circuit is placed, and are connected respectively to a part of the plurality of dummy cells included in the plurality of dummy columns.

4. The semiconductor memory device according to claim 2,
wherein the plurality of dummy word lines are connected to the memory array from a side opposite to a side where the amplifier circuit is placed, and are connected respectively to a part of the plurality of dummy cells included in the plurality of dummy columns.

5. The semiconductor memory device according to claim 2, wherein the plurality of dummy cells connected to the dummy word lines are placed with respect to the memory array at an edge portion on an opposite side to a side where the amplifier circuit is placed.

6. The semiconductor memory device according to claim 1,
wherein the memory array comprises a dummy column and a plurality of dummy rows that include the plurality of dummy cells,
the plurality of dummy word lines are connected to the plurality of dummy rows, and
the dummy column comprises one dummy bit line.

7. The semiconductor memory device according to claim 1,
wherein the memory array comprises a dummy column including the plurality of dummy cells, and
the plurality of dummy word lines respectively are connected to the dummy cells placed at different positions on the dummy column.

8. The semiconductor memory device according to claim 6, wherein the dummy bit line is connected to the dummy column selector.

9. The semiconductor memory device according to claim 8,
wherein the column selector comprises a transfer gate, and
the dummy column selector comprises a transfer gate having a same configuration as that of the transfer gate included in the column selector.

10. The semiconductor memory device according to claim 9, wherein a transistor constituting the transfer gate that is connected to the dummy bit line and is included in the dummy column selector has a source and a drain that are short-circuited.

11. The semiconductor memory device according to claim 1, wherein the dummy control circuit comprises a memory circuit that stores a test result.

12. The semiconductor memory device according to claim 11, further comprising a defect test terminal that is connected to the amplifier control circuit and measures a current of the dummy cells.

13. The semiconductor memory device according to claim 11, further comprising a defect test terminal that is connected to the amplifier control circuit and measures an output timing of the amplifier startup signal.

14. The semiconductor memory device according to claim 11, wherein the memory circuit is a nonvolatile memory circuit.

15. The semiconductor memory device according to claim 14, wherein the nonvolatile memory circuit comprises a fuse that can be disconnected with a laser.

* * * * *